US010553804B2

(12) United States Patent
Park et al.

(10) Patent No.: US 10,553,804 B2
(45) Date of Patent: Feb. 4, 2020

(54) ORGANIC LIGHT EMITTING DEVICE

(71) Applicant: RESEARCH & BUSINESS FOUNDATION SUNGKYUNKWAN UNIVERSITY, Suwon-si (KR)

(72) Inventors: June Kyun Park, Seongnam-si (KR); Yong Han Roh, Seoul (KR); Sang Hyun Lee, Seoul (KR); Byung Chan Seo, Suwon-si (KR); Jae Won Jeong, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/120,777

(22) Filed: Sep. 4, 2018

(65) Prior Publication Data

US 2019/0074462 A1 Mar. 7, 2019

(30) Foreign Application Priority Data

Sep. 1, 2017 (KR) ........................ 10-2017-0111574

(51) Int. Cl.
H01L 51/50 (2006.01)
H01L 51/52 (2006.01)
(Continued)

(52) U.S. Cl.
CPC ........ *H01L 51/502* (2013.01); *H01L 51/0007* (2013.01); *H01L 51/0045* (2013.01);
(Continued)

(58) Field of Classification Search
None
See application file for complete search history.

(56) References Cited

U.S. PATENT DOCUMENTS

2008/0007156 A1* 1/2008 Gibson .................. B82Y 20/00
313/503
2010/0240770 A1* 9/2010 Qi ...................... A61K 49/0067
514/769
(Continued)

FOREIGN PATENT DOCUMENTS

KR 10-2010-0067771 A 6/2010
KR 10-2012-0059063 A 6/2012
(Continued)

OTHER PUBLICATIONS

Medintz, Igor L., et al., "Reversible Modulation of Quantum Dot Photoluminescence Using a Protein-Bound Photochromic Fluorescence Resonance Energy Transfer Acceptor", *JACS Communications*, Dec. 16, 2003, pp. 30-31, vol. 126, Issue 1 (2 pages in English).

(Continued)

*Primary Examiner* — Benjamin P Sandvik
(74) *Attorney, Agent, or Firm* — NSIP Law

(57) ABSTRACT

The present disclosure relates to an organic light emitting device including: a first electrode; a second electrode provided to face the first electrode; and an electron transport layer, an emitting layer and a hole transport layer provided between the first electrode and the second electrode, and the emitting layer contains doped protein quantum dots.

15 Claims, 10 Drawing Sheets

• Horizontal structure

• Vertical structure

(51) Int. Cl.
*H01L 51/56* (2006.01)
*H01L 51/00* (2006.01)

(52) U.S. Cl.
CPC ...... *H01L 51/0093* (2013.01); *H01L 51/5056* (2013.01); *H01L 51/5072* (2013.01); *H01L 51/5296* (2013.01); *H01L 51/56* (2013.01); *H01L 2251/303* (2013.01)

(56) References Cited

U.S. PATENT DOCUMENTS

| | | | |
|---|---|---|---|
| 2014/0209888 A1* | 7/2014 | Hack | H01L 27/3213 257/40 |
| 2015/0125829 A1* | 5/2015 | Hyman | B44C 3/046 434/81 |

FOREIGN PATENT DOCUMENTS

| | | |
|---|---|---|
| KR | 10-2014-0007530 A | 1/2014 |
| KR | 10-2016-0150500 A | 12/2016 |

OTHER PUBLICATIONS

Dinesh, Bhimareddy, et al., "Self-assembly of diphenylalanine backbone homologues and their combination with functionalized carbon nanotubes", *Nanoscale: Royal Society of Chemistry*, Aug. 28, 2015, pp. 15873-15879, vol. 7 (7 pages in English).

* cited by examiner

ORGANIC LIGHT EMITTING DEVICE

CROSS REFERENCE TO RELATED APPLICATION(S)

This application claims the benefit under 35 U.S.C. 119(e) of Korean Patent Application No. 10-2017-0111574 filed on Sep. 1, 2017 in the Korean Intellectual Property Office, the entire disclosure if which is incorporated by reference for all purposes.

TECHNICAL FIELD

The present disclosure relates to an organic light emitting device including protein quantum dots and a method of preparing the protein quantum dots.

BACKGROUND

Displays have been used in computers, televisions and large billboards to generally provide information and thus have become essential for life. With the recent advancement of display technology and improvement in quality of life, there has been a demand for research and development of a display having multiple functions to improve the quality of life as well as a conventional function to simply provide information. Accordingly, in future-oriented research on flexible display and wearable display using thin and light materials, organic light-emitting diode (OLED) has presented lots of possibility and various indicators. An OLED display is a self-light emitting display device and can be manufactured into a lightweight and thin form. Further, the OLED display has an excellent contrast ratio, a wide viewing angle, and a high response speed. Furthermore, as compared to a liquid crystal display (LCD) which is also an important material for display, the OLED display does not require a backlight which occupies a large volume in the LCD and thus has many advantages in manufacturing of a flexible and transparent device.

An OLED is equipped with an organic compound layer formed between an anode and a cathode. The organic compound layer includes a hole injection layer (HIL), a hole transport layer (HTL), an emission layer (EML), an electron transport layer (ETL), and an electron Injection layer (EIL). When a driving voltage is applied to the anode and the cathode, holes passing through the HTL and electrons passing through the ETL are combined into excitons in the EML, and the excitons emit visible light to implement the gradation of the organic light emitting display device while transitioning from an excited state to a ground state. Typically, a low molecular or high molecular organic light emitting material can be used as a material of the EML.

Meanwhile, if an organic light emitting device is manufactured using a material including light emitting quantum dots besides a low molecular or high molecular material, it is possible to manufacture a high-resolution organic light emitting device with excellent emission properties. Herein, the quantum dots refer to nano crystals of several nm in diameter and have optical, magnetic, and electrical properties different from those of bulk states. These properties vary depending on the diameter of a material. The quantum dots may have a dot, nanorod, or branched shape. If the quantum dots are formed into a dot shape, each quantum dot may include a core as a central part, an overcoating surrounding the core, and a cap molecule surrounding the overcoating and may have a size of from about 2 nm to about 20 nm. The core refers to a central part of the quantum dot and emits light. The overcoating surrounding the core covers the core and reduces non-radiative relaxation. The cap molecule suppresses agglomeration or precipitation of the quantum dots in a colloidal solution and enables the quantum dots to be stably dispersed. Further, if the quantum dots are formed into a dot shape, each quantum dot may include only a core or may include only a core as a central part and a shell as an overcoating surrounding the core.

However, the quantum dots are mainly formed of heavy metals such as cadmium (Cd) and thus may cause environmental pollution or the like.

The paper (Nanoscale, 2015, 7, 15873-15879) which is the background technology of the present disclosure discloses a method of preparing protein quantum dots by self-assembling proteins. However, this paper does not describe an organic light emitting device using protein quantum dots.

SUMMARY

In view of the foregoing, the present disclosure provides an organic light emitting device.

However, problems to be solved by the present disclosure are not limited to the above-described problems. There may be other problems to be solved by the present disclosure.

According to a first aspect of the present disclosure, there is provided an organic light emitting device including: a first electrode; a second electrode provided to face the first electrode; and an electron transport layer, an emitting layer and a hole transport layer provided between the first electrode and the second electrode, and the emitting layer contains doped protein quantum dots.

According to an embodiment of the present disclosure, the doped protein quantum dots may be doped with a material selected from the group consisting of Ir, Ru, Rh, Os, Tc, Re, Mo, W, and combinations thereof, but may not be limited thereto.

According to an embodiment of the present disclosure, the doped protein quantum dots may have a nanosphere shape, but may not be limited thereto.

According to an embodiment of the present disclosure, the doped protein quantum dots may contain a protein selected from the group consisting of tert-butyloxycarbonyl-diphenylalanine (Boc-Diphenylalanine), phenylalanine, tryptophan, tyrosine, leucine, valine, isoleucine, histidine, and combinations thereof, but may not be limited thereto.

According to an embodiment of the present disclosure, the organic light emitting device may further include a graphene layer and an oxide layer formed on the electron transport layer, but may not be limited thereto.

According to an embodiment of the present disclosure, the graphene layer and the oxide layer may control a Schottky barrier of the organic light emitting device, but may not be limited thereto.

According to an embodiment of the present disclosure, the graphene layer and the oxide layer may protect the emitting layer against oxygen and/or moisture, but may not be limited thereto.

According to an embodiment of the present disclosure, the oxide layer may contain a metal oxide selected from the group consisting of $TiO_2$, $SnO_2$, $ZnO$, $WO_3$, $Nb_2O_5$, $TiSrO_3$, $SiO_2$, $Al_2O_3$, $MgO$, $Cr_2O_3$, $Fe_3O_4$, and combinations thereof, but may not be limited thereto.

According to an embodiment of the present disclosure, any one of the first electrode and the second electrode may be an anode and the other one may be a cathode, but may not be limited thereto.

According to a second aspect of the present disclosure, there is provided a method of preparing protein quantum dots, including: preparing a protein solution by dissolving a protein in a primary solvent; preparing protein quantum dots by adding a secondary solvent into the protein solution to self-assemble the protein; and adding a doping material to the protein quantum dots.

According to an embodiment of the present disclosure, the emission wavelength of the protein quantum dots may be controlled depending on the doping material, but may not be limited thereto.

According to an embodiment of the present disclosure, the doping material may contain a metal selected from the group consisting of Ir, Ru, Rh, Os, Tc, Re, Mo, W, and combinations thereof, but may not be limited thereto.

According to an embodiment of the present disclosure, the protein may include a protein selected from the group consisting of tert-butyloxycarbonyl-diphenylalanine (Boc-Diphenylalanine), phenylalanine, tryptophan, tyrosine, leucine, valine, isoleucine, histidine, and combinations thereof, but may not be limited thereto.

According to an embodiment of the present disclosure, the primary solvent may include a solvent selected from the group consisting of hexafluoroisopropanol (HFIP), formic acid, cresol, xylene, nitrobenzene, dimethylformamide, dimethylacetamide, and combinations thereof, but may not be limited thereto.

According to an embodiment of the present disclosure, the secondary solvent may include a solvent selected from the group consisting of ethanol, methanol, water, and combinations thereof, but may not be limited thereto.

The above-described aspects are provided by way of illustration only and should not be construed as liming the present disclosure. Besides the above-described embodiments, there may be additional embodiments described in the accompanying drawings and the detailed description.

According to the above-described aspects of the present disclosure, an organic light emitting device of the present disclosure uses a protein for an emitting layer instead of a heavy metal such as cadmium. Thus, it is environment friendly and harmless to humans. Further, protein quantum dots are doped with a material such as Ir, Ru, or the like, and, thus, the emission wavelength thereof can be easily controlled. For example, the protein quantum dots can emit a green light if doped with an Ir compound and can emit a red light if doped with a Ru compound.

The organic light emitting device of the present disclosure further includes a graphene layer and an oxide layer and thus can easily control a Schottky barrier. Therefore, electrons can be easily transported between materials, such as a metal and an organic semiconductor, different in energy level, and the efficiency of the organic light emitting device can be increased. Further, the graphene layer and the oxide layer protect the emitting layer of the organic light emitting device against oxygen and/or moisture which may permeate from the outside. Therefore, it is possible to implement an organic light emitting device with high reliability and a long lifetime.

A protein has a band gap of 5 eV or more. Therefore, carriers injected from both electrodes are trapped in the emitting layer EML by a quantum well. Thus, the position of emission is fixed only at a dopant within the EML, which causes an increase in emission efficiency. Therefore, it is possible to suppress the injection of excessive electrons or holes into opposite electrodes caused by a mobility difference in a carrier transport layer and the consumption thereof as heat.

In order to control a Schottky barrier between a metal and an organic semiconductor, a material having a suitable work function needs to be used. The organic light emitting device according to the present disclosure can control the height of a Schottky barrier by using applied voltage, and, thus, it is less limited to material to be used.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
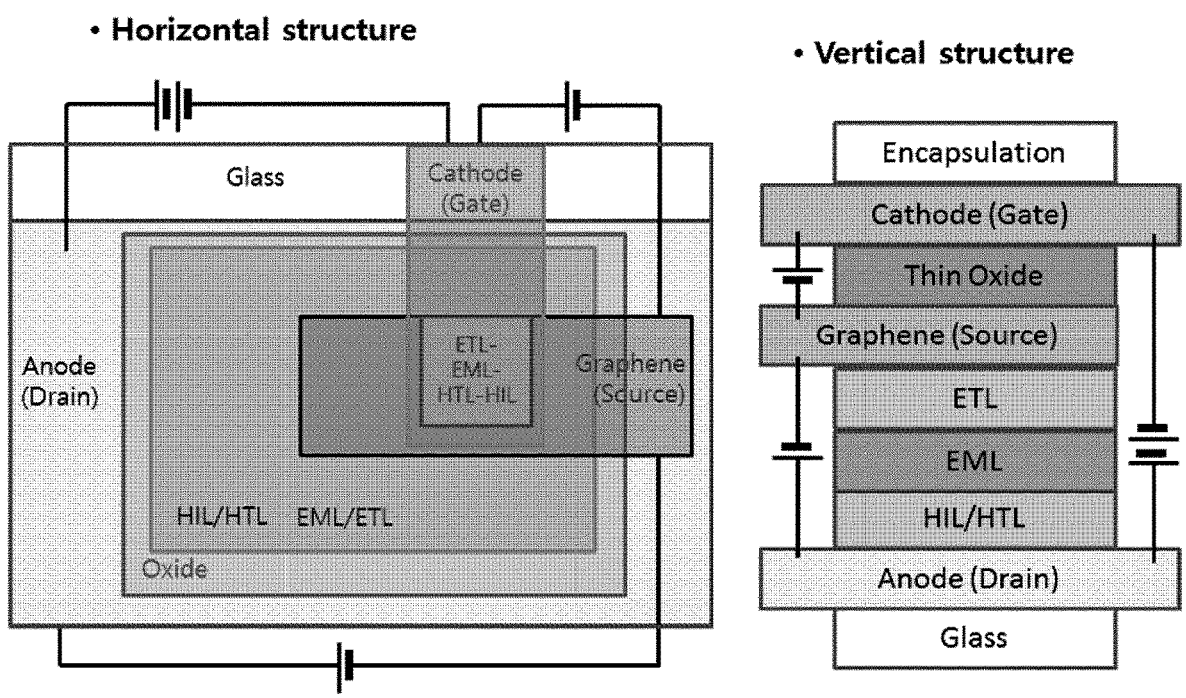
FIG. 1 shows a structure of an organic light emitting device according to an embodiment of the present disclosure.

Hereinafter, embodiments of the present disclosure will be described in detail with reference to the accompanying drawings so that the present disclosure may be readily implemented by those skilled in the art.

However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the terms "on", "above", "on an upper end", "below", "under", and "on a lower end" that are used to designate a position of one element with respect to another element include both a case that the one element is adjacent to the other element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Hereinafter, an organic light emitting device according to the present disclosure will be described in detail with reference to embodiments, examples and the accompanying drawings. However, the present disclosure may not be limited to the following embodiments, examples and drawings.

A first aspect of the present disclosure relates to an organic light emitting device including: a first electrode; a second electrode provided to face the first electrode; and an electron transport layer, an emitting layer and a hole transport layer provided between the first electrode and the second electrode, and the emitting layer contains doped protein quantum dots.

According to an embodiment of the present disclosure, the doped protein quantum dots may be doped with a material selected from the group consisting of Ir, Ru, Rh, Os, Tc, Re, Mo, W, and combinations thereof, but may not be limited thereto.

If the doped protein quantum dots are doped with a material containing Ir, the doped protein quantum dots may emit a green light around 530 nm.

If the doped protein quantum dots are doped with a material containing Ru, the doped protein quantum dots may emit a red light around 620 nm.

According to an embodiment of the present disclosure, the doped protein quantum dots may have a nanosphere shape, but may not be limited thereto.

The doped protein quantum dots may further have a nanorod shape and a branched shape, but may not be limited thereto.

According to an embodiment of the present disclosure, the doped protein quantum dots may contain a protein selected from the group consisting of tert-butyloxycarbonyl-diphenylalanine (Boc-Diphenylalanine), phenylalanine, tryptophan, tyrosine, leucine, valine, isoleucine, histidine, and combinations thereof, but may not be limited thereto.

The organic light emitting device uses a protein for an emitting layer instead of a heavy metal such as cadmium. Thus, it is environment friendly and harmless to humans. Further, the protein quantum dots are doped with a material such as Ir, Ru, or the like, and, thus, the emission wavelength thereof can be easily controlled. For example, the protein quantum dots can emit a green light if doped with an Ir compound and can emit a red light if doped with a Ru compound.

A protein has a wide band gap of 5 eV or more and thus has insulating properties. A quantum well is formed in a band diagram, and, thus, carriers such as electrons and holes injected into quantum dots are trapped in the quantum well but cannot escape from the quantum well. Therefore, light is emitted only at a dopant and the emission efficiency is high. Further, by keeping a balance between carriers which are injected in a nonuniform manner due to a mobility difference, it is possible to suppress the occurrence of leakage current caused by excessive carriers. Therefore, it is possible to improve the lifetime and electroluminescent efficiency of the device.

According to an embodiment of the present disclosure, the organic light emitting device may further include a graphene layer and an oxide layer formed on the electron transport layer, but may not be limited thereto.

According to an embodiment of the present disclosure, the graphene layer and the oxide layer may control a Schottky barrier of the organic light emitting device, but may not be limited thereto.

According to an embodiment of the present disclosure, the graphene layer and the oxide layer may protect the emitting layer against oxygen and/or moisture, but may not be limited thereto.

According to an embodiment of the present disclosure, the oxide layer may contain a metal oxide selected from the group consisting of $TiO_2$, $SnO_2$, $ZnO$, $WO_3$, $Nb_2O_5$, $TiSrO_3$, $SiO_2$, $Al_2O_3$, $MgO$, $Cr_2O_3$, $Fe_3O_4$, and combinations thereof, but may not be limited thereto.

When a voltage is applied to the organic light emitting device, the graphene functions as an N-type semiconductor due to energy band bending, and, thus, electrons can be easily transported and a Schottky barrier can be controlled. When a negative voltage is applied to the graphene layer, the Schottky barrier is lowered, and, thus, electrons can be easily transported between materials, such as a metal and an organic semiconductor, different in energy level. Therefore, the efficiency of the organic light emitting device can be increased.

Further, the graphene layer and the oxide layer protect the emitting layer against oxygen and/or moisture which may permeate from the outside. Therefore, it is possible to implement a quantum dot-light emitting diode (QD-LED) with high reliability and a long lifetime.

The energy level may collectively refer to work function level, conduction band level, valence band level, Highest Occupied Molecular Orbital (HOMO) level, and Lowest Unoccupied Molecular Orbital (LUMO) level. Specifically, if a target material of the energy level is a metal, the energy level may refer to the work function level. Further, if a target material of the energy level is an inorganic material or an inorganic semiconductor, the energy level may refer to the conduction band level or the valence band level. Furthermore, if a target material of the energy level is an organic material or an organic semiconductor, the energy level may refer to the HOMO level or the LUMO level.

FIG. 1 shows a structure of an organic light emitting device according to an embodiment of the present disclosure.

Referring to FIG. 1, the organic light emitting device may include a first electrode, a second electrode provided to face the first electrode, and an electron transport layer (ETL), an emitting layer (EML) and a hole transport layer (HTL) provided between the first electrode and the second electrode. The organic light emitting device may further include a hole injection layer (HIL), an electron injection layer (EIL), a substrate, and an encapsulation layer. Further, the organic light emitting device may include a graphene layer and an oxide layer.

According to an embodiment of the present disclosure, any one of the first electrode and the second electrode may be an anode and the other one may be a cathode, but may not be limited thereto.

Forward voltage application refers to allowing a current to flow from the anode toward the cathode, and reverse voltage application refers to allowing a current to flow from the cathode toward the anode.

The organic light emitting device may have a sandwich structure in which the first electrode and the second electrode are face-jointed, but may not be limited thereto.

If an appropriate organic layer and/or an appropriate inorganic layer is positioned between the first electrode and the second electrode, when a voltage is applied between the two electrodes, holes are injected from an anode and electrons are injected from a cathode into the organic layer and/or the inorganic layer. The injected holes and electrons are combined into excitons, and when the excitons fall to the ground state again, light is generated and emitted.

The first electrode may be a transparent electrode.

If the first electrode is a transparent electrode, the first electrode may be a conductive oxide such as indium tin oxide or indium zinc oxide. Further, the first electrode may be a translucent electrode. If the first electrode is a translucent electrode, it can be manufactured using a translucent metal such as Ag, Au, Mg, Ca, or an alloy thereof. If the translucent metal is used for the first electrode, the organic light emitting device may have a micro cavity structure.

The anode may be formed of, desirably, a material having a high work function to facilitate hole injection. For example, the material may include metals or alloys including V, Cr, Cu, Zn, Au, and combinations thereof; metal oxides such as zinc oxide, indium oxide, indium tin oxide (ITO), and indium zinc oxide (IZO); combinations of metals and oxides such as ZnO:Al or $SnO_2$:Sb; and conductive polymers such as poly(3-methylthiophene), poly[3,4-(ethylene-1,2-dioxy) thiophene] (PEDOT), polypyrrole, and polyaniline, but may not be limited thereto.

The material of the anode is not limited to the anode, but can be used as a material of the cathode.

The cathode may be formed of, desirably, a material having a low work function to facilitate electron injection. For example, the material may include metals or alloys including Mg, Ca, Na, K, Ti, In, Y, Li, Gd, Al, Ag, Sn, Pb, and combinations thereof; and materials having a multilayer structure such as LiF/Al or $LiO_2$/Al, but may not be limited thereto.

The material of the cathode is not limited to the cathode, but can be used as a material of the anode.

The HTL may be formed of, desirably, a material having a high hole mobility which can receive holes from the anode or the HIL and transfer the holes to the EML. For example, the material may include a material selected from the group consisting of arylamine-based organic materials, conductive polymers, block copolymers having conjugated and non-conjugated blocks, and combinations thereof, but may not be limited thereto.

The EML may be formed of, desirably, a material having a high quantum efficiency with respect to fluorescence or phosphorescence which can receive holes and electrons from the HTL and the ETL, respectively, and combine the holes and electrons to emit visible light. For example, the protein quantum dots are doped with the doping material and thus have a high quantum efficiency.

The ETL may be formed of, desirably, a material having a high electron mobility which can receive electrons from the cathode and transfer the electrons to the EML. For example, the material may include a material selected from the group consisting of Al complexes with 8-hydroxyquinoline; complexes containing Alq3; organic radical compounds; hydroxyflavone-metal complexes, and combinations thereof, but may not be limited thereto.

The encapsulation layer may be formed of a transparent resin layer. The encapsulation layer may function to protect the organic light emitting device against oxygen and pollutants and may be formed of a transparent material in order not to inhibit emission from the organic light emitting device. The transparency may refer to 60% or more transmission of light. Specifically, the transparency may refer to 75% or more transmission of light.

A substrate having excellent transparency, surface smoothness, ease of handling, and water repellency may be used as the substrate. For example, the substrate may include a substrate selected from the group consisting of a glass substrate, a thin-film glass substrate, a transparent plastic substrate, and combinations thereof. The plastic substrate may include a plastic substrate selected from the group consisting of polyether sulfone (PES), polyethylene naphthalate (PEN), polyethylene terephthalate (PET), polycarbonate (PC), polystyrene (PS), polyimide (PI), polyethylene (PE), polyether ether ketone (PEEK), and combinations thereof, but may not be limited thereto.

Figure 2:
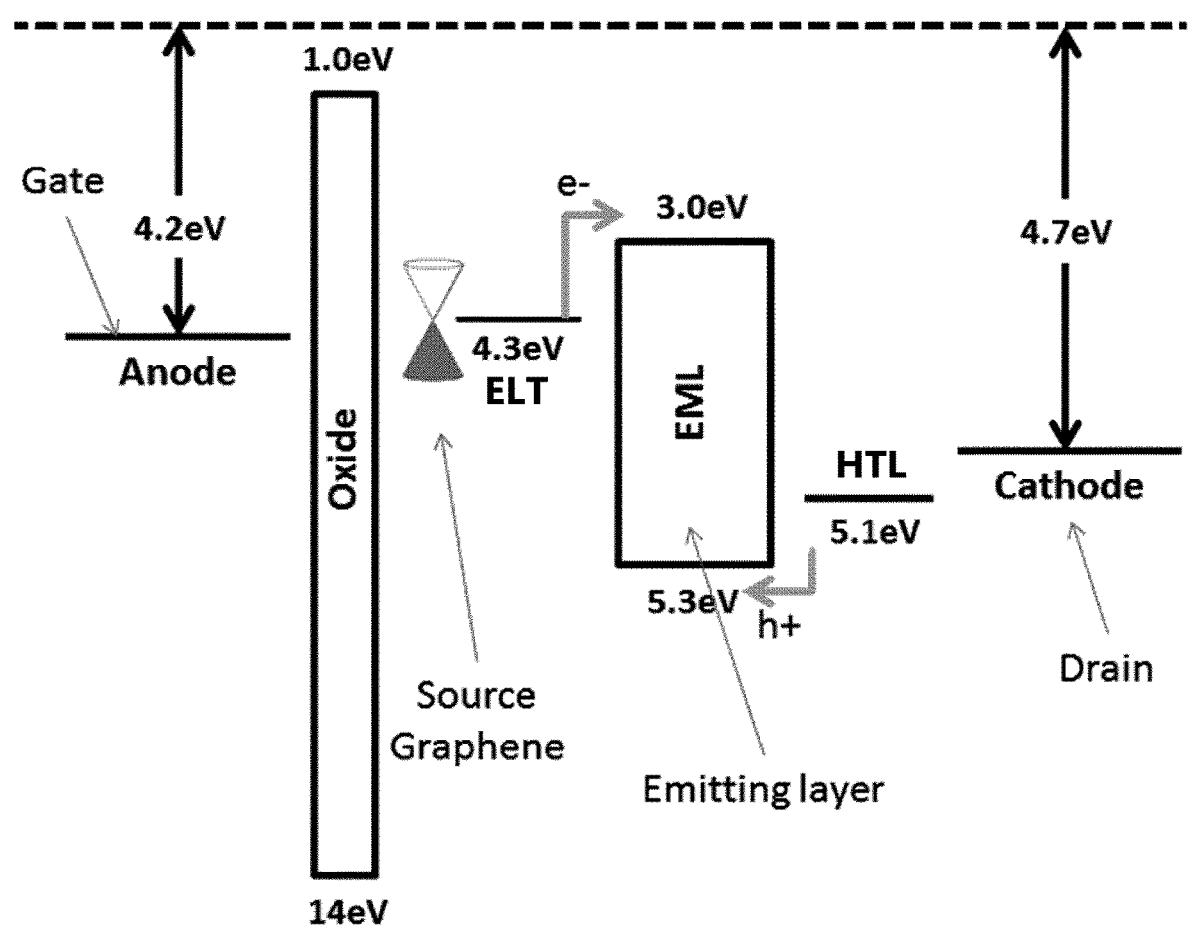
FIG. 2 is a schematic diagram illustrating an organic light emitting device according to an embodiment of the present disclosure.

FIG. 2 is a schematic diagram illustrating an organic light emitting device according to an embodiment of the present disclosure.

The present disclosure provides a display apparatus including the organic light emitting device. In the display apparatus, the organic light emitting device can function as a pixel or a backlight. The other components of the display apparatus may be the same as those known in the art.

The present disclosure provides a lighting apparatus including the organic light emitting device. In the lighting apparatus, the organic light emitting device functions as a light emitting unit. The other components required for the lighting apparatus may be the same as those known in the art.

A second aspect of the present disclosure provides a method of preparing protein quantum dots, including: preparing a protein solution by dissolving a protein in a primary solvent; preparing protein quantum dots by adding a secondary solvent into the protein solution to self-assemble the protein; and adding a doping material to the protein quantum dots.

Figure 3:
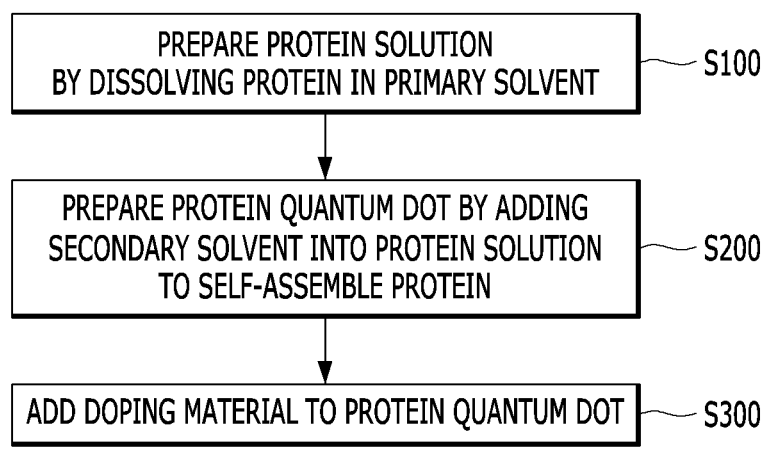
FIG. 3 is a flowchart showing a method of preparing protein quantum dots according to an embodiment of the present disclosure.
Figure 4A:
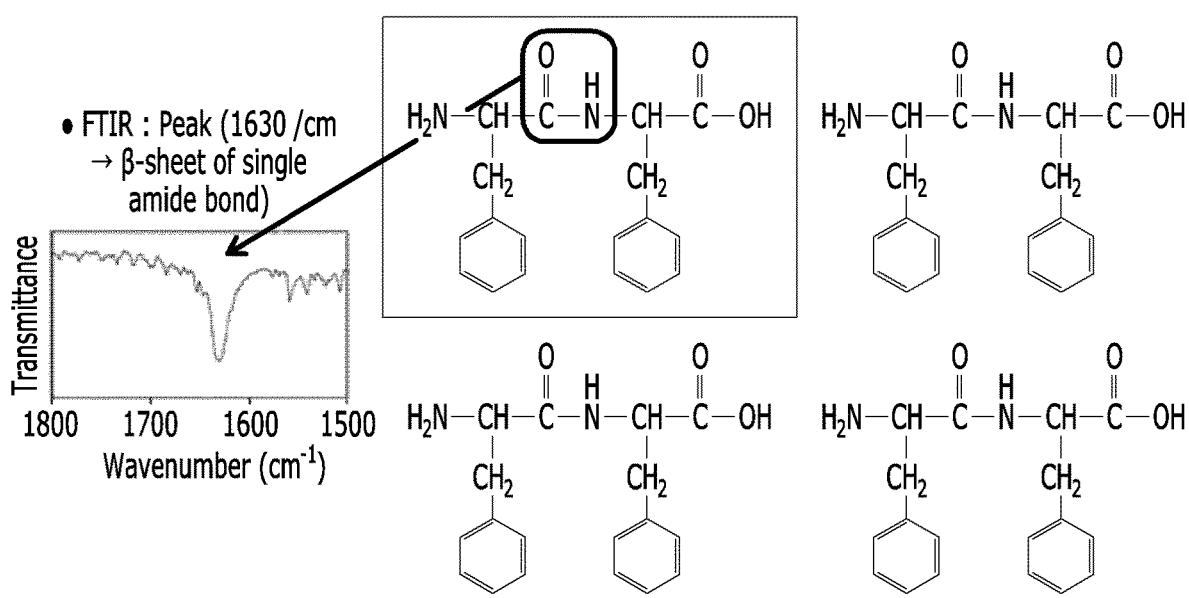
FIG. 4A to FIG. 4D are schematic diagrams illustrating a process of forming protein quantum dots by self-assembly according to an example of the present disclosure.
Figure 4B:
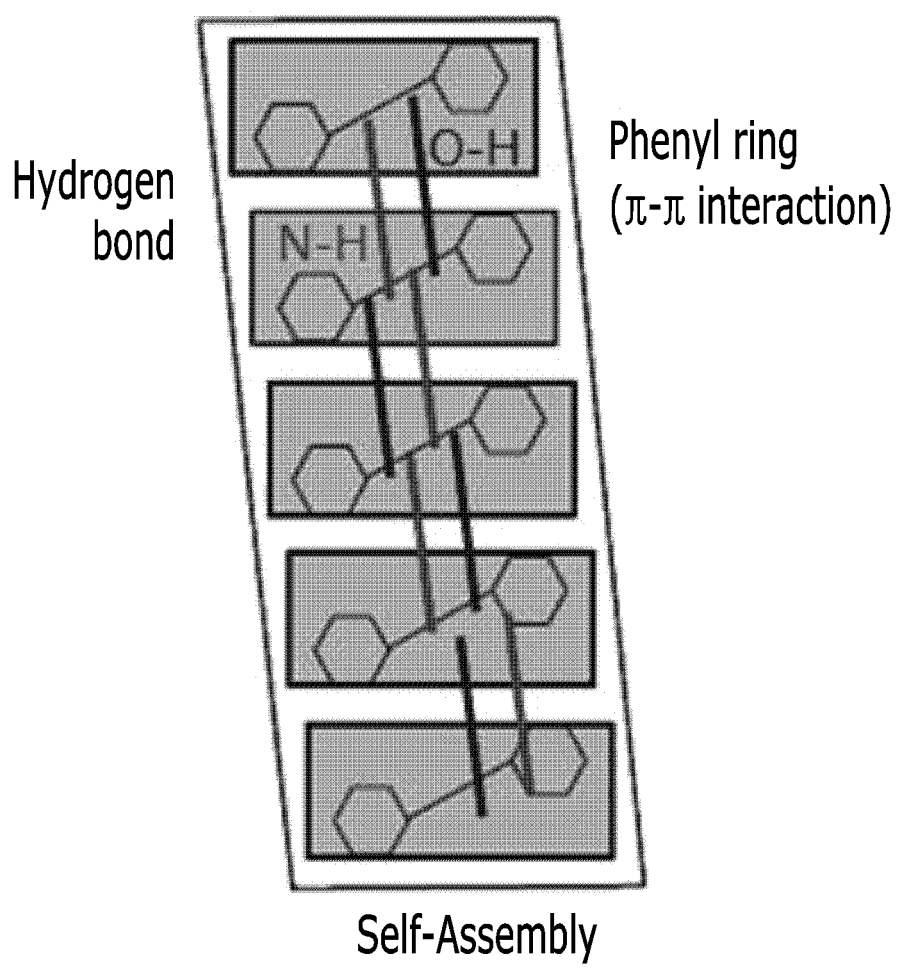
Figure 4C:
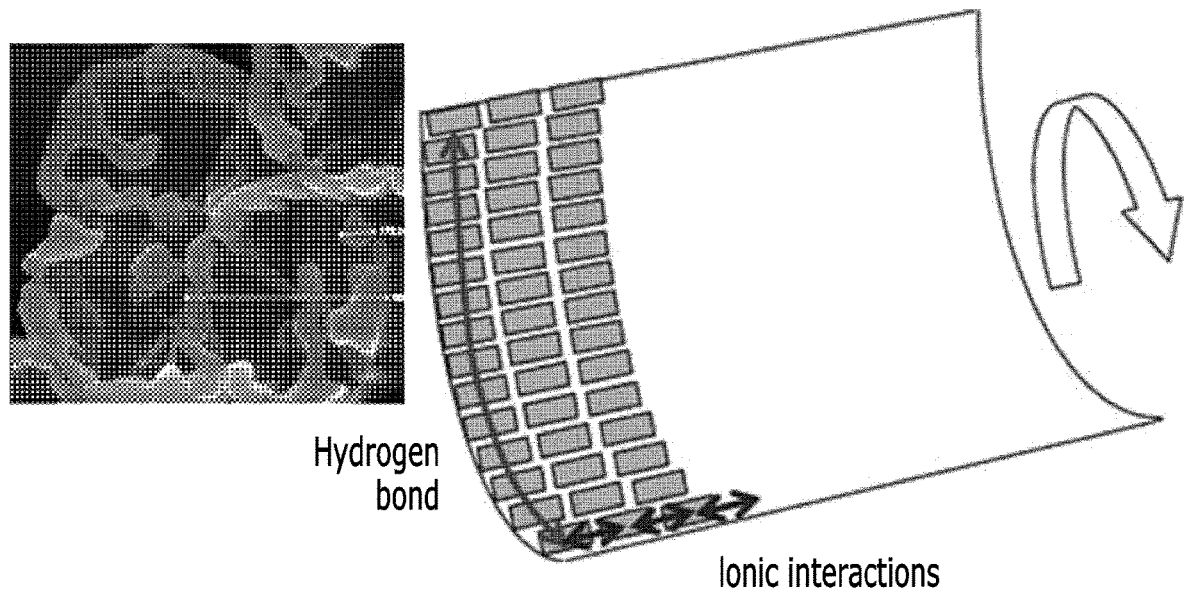
Figure 4D:
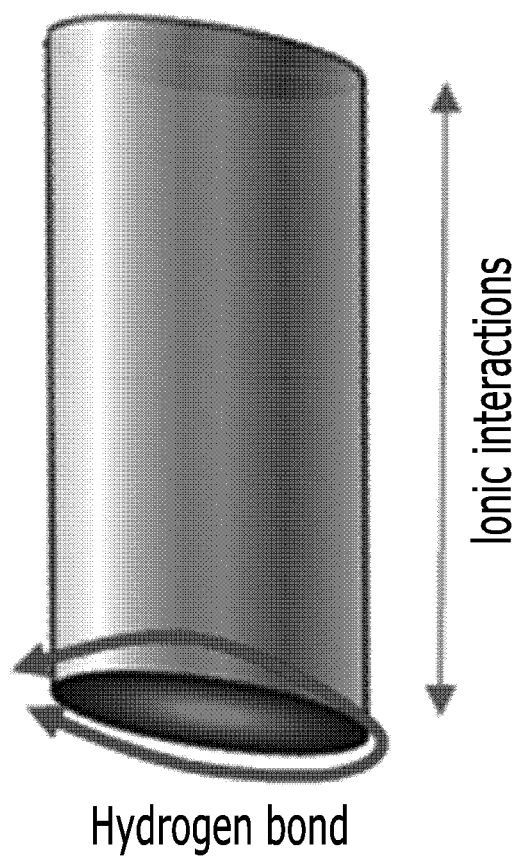

FIG. 3 is a flowchart showing a method of preparing protein quantum dots according to an embodiment of the present disclosure.

Firstly, a protein solution is prepared by dissolving a protein in a primary solvent (S100).

According to an embodiment of the present disclosure, the protein may include a protein selected from the group consisting of tert-butyloxycarbonyl-diphenylalanine (Boc-Diphenylalanine), phenylalanine, tryptophan, tyrosine, leucine, valine, isoleucine, histidine, and combinations thereof, but may not be limited thereto.

According to an embodiment of the present disclosure, the primary solvent may include a solvent selected from the group consisting of hexafluoroisopropanol (HFIP), formic acid, cresol, xylene, nitrobenzene, dimethylformamide, dimethylacetamide, and combinations thereof, but may not be limited thereto.

Then, protein quantum dots are prepared by adding a secondary solvent into the protein solution to self-assemble the protein (S200).

According to an embodiment of the present disclosure, the secondary solvent may include a solvent selected from the group consisting of ethanol, methanol, water, and combinations thereof, but may not be limited thereto.

The self-assembly may be conducted by hydrogen bonds and ionic bonds between functional groups of the protein, but may not be limited thereto.

The functional groups may include amide bonds.

If the secondary solvent is ethanol, the protein quantum dots may have a nanosphere shape, but may not be limited thereto.

If the secondary solvent is water, the protein quantum dots may have a nanowire shape, but may not be limited thereto.

Then, a doping material is added to the protein quantum dots (S300).

According to an embodiment of the present disclosure, the emission wavelength of the protein quantum dots may be controlled depending on the doping material, but may not be limited thereto.

If the protein quantum dots are doped with a material containing Ir, the doped protein quantum dots may emit a green light around 530 nm.

If the protein quantum dots are doped with a material containing Ru, the doped protein quantum dots may emit a red light around 620 nm.

The protein quantum dots may have a nanosphere, nanorod, or branched shape, but may not be limited thereto.

According to an embodiment of the present disclosure, the doping material may contain a metal selected from the group consisting of Ir, Ru, Rh, Os, Tc, Re, Mo, W, and combinations thereof, but may not be limited thereto.

Hereinafter, the present disclosure will be described in more detail with reference to examples. The following examples are provided only for explanation, but do not intend to limit the scope of the present disclosure.

EXAMPLE 1

Protein quantum dots having a nanosphere shape in which tert-butyloxycarbonyl-diphenylalanine was self-assembled were formed by dissolving tert-butyloxycarbonyl-diphenylalanine in hexafluoroisopropanol (HFIP) and adding ethanol thereto.

FIG. 4A to FIG. 4D are schematic diagrams illustrating a process of forming protein quantum dots by self-assembly according to an example of the present disclosure.

Green-protein quantum dots were formed by adding Ir(ppy)$_3$ as a dopant to the protein quantum dots, and red-protein quantum dots were formed by adding Ru(bpy)$_3^{2+}$ as a dopant to the protein quantum dots.

EXMAPLE 2

A glass substrate coated with an indium tin oxide (ITO) thin film was used to manufacture an organic light emitting device. PEDOT:PSS, PVK, the green-protein quantum dots prepared in Example 1, TPBi, and LiF/Al were coated and/or deposited in sequence on the ITO to manufacture a green-organic light emitting device.

EXMAPLE 3

A glass substrate coated with an indium tin oxide (ITO) thin film was used to manufacture an organic light emitting device. PEDOT:PSS, PVK, the red-protein quantum dots prepared in Example 1, TPBi, ZnO, and LiF/Al were coated and/or deposited in sequence on the ITO to manufacture a red-organic light emitting device.

TEST EXAMPLE

Figure 5:
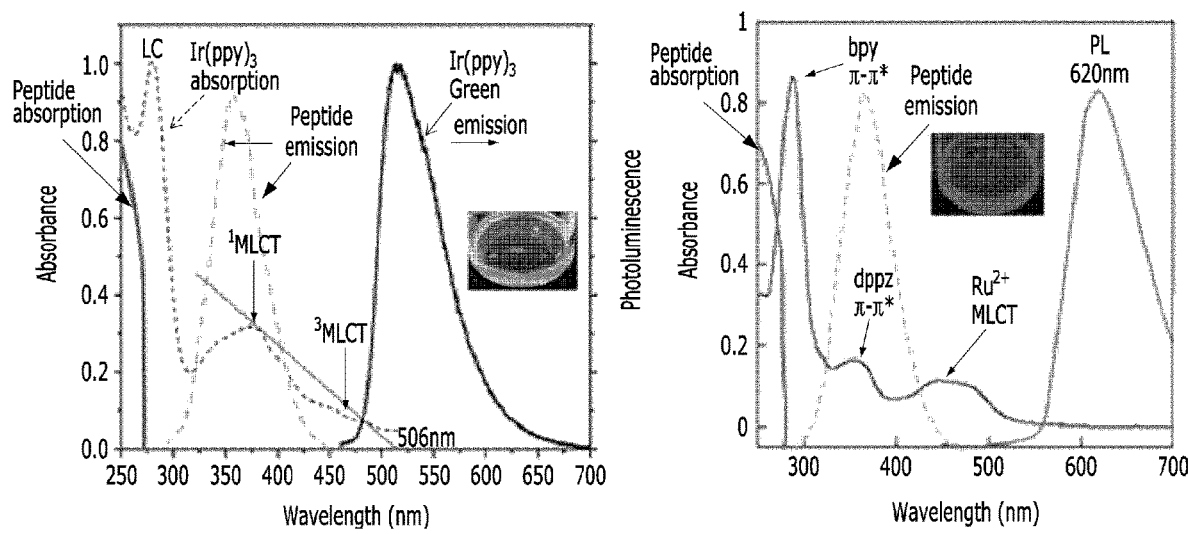
FIG. 5 provides graphs showing absorption and emission wavelengths of protein quantum dots according to an example of the present disclosure, and insets are photoluminescence (PL) images shown when 365 nm UV are irradiated.

The properties of the green-protein quantum dots and the red-protein quantum dots prepared in Example 1 were checked and the result thereof was as shown in FIG. 5.

FIG. 5 provides graphs showing absorption and emission wavelengths of protein quantum dots according to an example of the present disclosure, and insets are photoluminescence (PL) images shown when 365 nm UV are irradiated.

According to the result shown in FIG. 5, protein absorption occurs at 250 nm and protein emission occurs at 380 nm. Since Ir(ppy)$_3$ of Example 1 was used for doping, green light emission occurred at 530 nm. Further, since Ru(bpy)$_3^{2+}$ of Example 1 was used for doping, red light emission occurred at 620 nm.

The properties of the green-organic light emitting device and the red-organic light emitting device manufactured in Examples 2 and 3 were checked and the result thereof was as shown in FIG. 6.

Figure 6A:
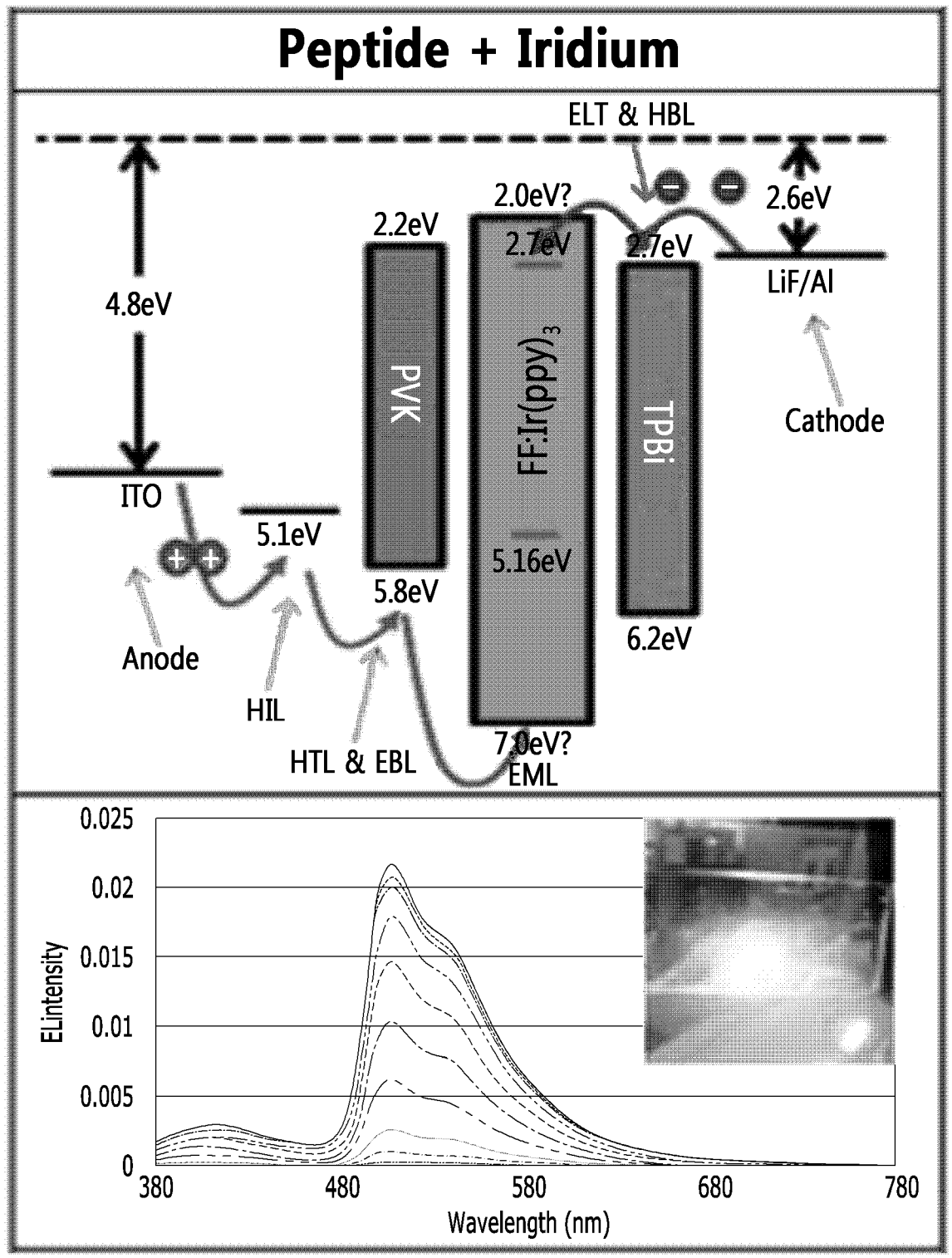
FIG. 6A and FIG. 6B provide a schematic diagram of an organic light emitting device according to an example of the present disclosure and a graph showing PL, respectively.
Figure 6B:
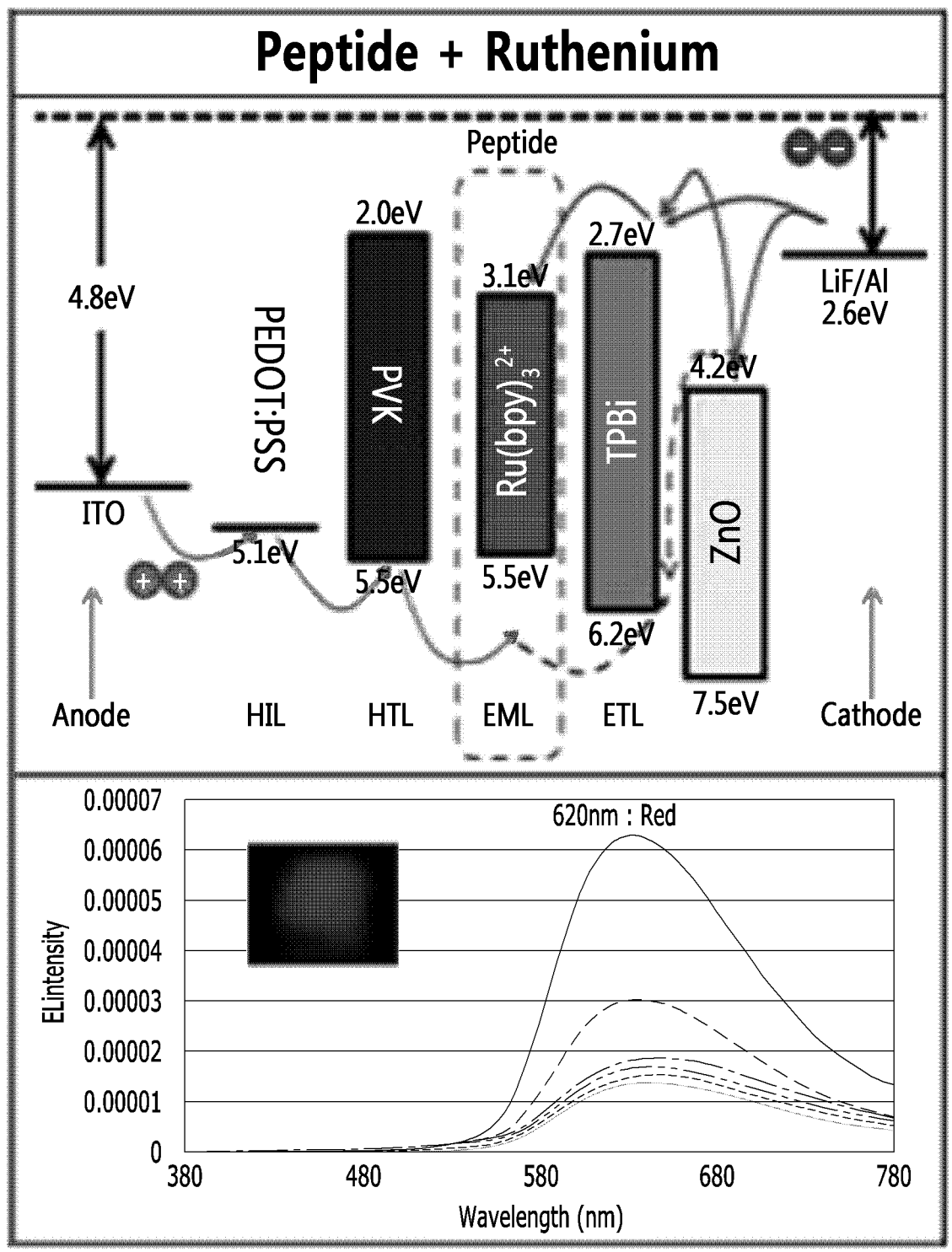

FIG. 6A and FIG. 6B provide a schematic diagram of an organic light emitting device according to an example of the present disclosure and a graph showing PL, respectively.

According to the result shown in FIG. 6, since Ir(ppy)$_3$ of Example 1 was used for doping, green light emission occurred. Further, since Ru(bpy)$_3^{2+}$ of Example 1 was used for doping, red light emission occurred.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. An organic light emitting device, comprising:
   a first electrode;
   a second electrode provided to face the first electrode; and
   an electron transport layer, an emitting layer and a hole transport layer provided between the first electrode and the second electrode,
   wherein the emitting layer contains doped protein quantum dots, and
   wherein the doped protein quantum dots are doped with a material selected from the group consisting of Ir, Ru, Rh, Os, Tc, Re, Mo, W, and combinations thereof.

2. The organic light emitting device of claim 1, wherein the doped protein quantum dots have a nanosphere shape.

3. The organic light emitting device of claim 1, wherein the doped protein quantum dots contain a protein selected from the group consisting of tert-butyloxycarbonyl-diphenylalanine (Boc-Diphenylalanine), phenylalanine, tryptophan, tyrosine, leucine, valine, isoleucine, histidine, and combinations thereof.

4. The organic light emitting device of claim 1, further comprising:
a graphene layer and an oxide layer formed on the electron transport layer.

5. The organic light emitting device of claim 4, wherein the graphene layer and the oxide layer control a Schottky barrier of the organic light emitting device.

6. The organic light emitting device of claim 4, wherein the graphene layer and the oxide layer protect the emitting layer against oxygen and/or moisture.

7. The organic light emitting device of claim 4, wherein the oxide layer contains a metal oxide selected from the group consisting of $TiO_2$, $SnO_2$, $ZnO$, $WO_3$, $Nb_2O_5$, $TiSrO_3$, $SiO_2$, $Al_2O_3$, $MgO$, $Cr_2O_3$, $Fe_3O_4$, and combinations thereof.

8. The organic light emitting device of claim 1, wherein any one of the first electrode and the second electrode is an anode and the other one is a cathode.

9. An organic light emitting device, comprising:
a first electrode;
a second electrode provided to face the first electrode; and
an electron transport layer, an emitting layer and a hole transport layer provided between the first electrode and the second electrode,
wherein the emitting layer contains doped protein quantum dots, and
wherein the doped protein quantum dots contain a protein selected from the group consisting of tert-butyloxycarbonyl-diphenylalanine (Boc-Diphenylalanine), phenylalanine, tryptophan, tyrosine, leucine, valine, isoleucine, histidine, and combinations thereof.

10. The organic light emitting device of claim 9, wherein any one of the first electrode and the second electrode is an anode and the other one is a cathode.

11. An organic light emitting device, comprising:
a first electrode;
a second electrode provided to face the first electrode;
an electron transport layer, an emitting layer and a hole transport layer provided between the first electrode and the second electrode; and
a graphene layer and an oxide layer formed on the electron transport layer,
wherein the emitting layer contains doped protein quantum dots.

12. The organic light emitting device of claim 11, wherein the graphene layer and the oxide layer control a Schottky barrier of the organic light emitting device.

13. The organic light emitting device of claim 11, wherein the graphene layer and the oxide layer protect the emitting layer against oxygen and/or moisture.

14. The organic light emitting device of claim 11, wherein the oxide layer contains a metal oxide selected from the group consisting of $TiO_2$, $SnO_2$, $ZnO$, $WO_3$, $Nb_2O_5$, $TiSrO_3$, $SiO_2$, $Al_2O_3$, $MgO$, $Cr_2O_3$, $Fe_3O_4$, and combinations thereof.

15. The organic light emitting device of claim 11, wherein any one of the first electrode and the second electrode is an anode and the other one is a cathode.

* * * * *